US009065459B1

(12) United States Patent
Buell (10) Patent No.: US 9,065,459 B1
(45) Date of Patent: Jun. 23, 2015

(54) CLOCK GENERATION CIRCUITS USING JITTER ATTENUATION CONTROL CIRCUITS WITH DYNAMIC RANGE SHIFTING

(71) Applicant: Integrated Device Technology, Inc., San Jose, CA (US)

(72) Inventor: Brian Buell, Gilbert, AZ (US)

(73) Assignee: Integrated Device Technology, Inc., San Jose, CA (US)

(*) Notice: Subject to any disclaimer, the term of this patent is extended or adjusted under 35 U.S.C. 154(b) by 70 days.

(21) Appl. No.: 13/829,202

(22) Filed: Mar. 14, 2013

(51) Int. Cl.
*H03L 7/087* (2006.01)
*H03L 7/197* (2006.01)
*H03L 7/22* (2006.01)

(52) U.S. Cl.
CPC ............... *H03L 7/22* (2013.01); *H03L 7/1974* (2013.01); *H03L 7/087* (2013.01)

(58) Field of Classification Search
CPC ............. H03L 7/06; H03L 7/08; H03L 7/081; H03L 7/085; H03L 7/087; H03L 7/101; H03L 7/103; H03L 7/104; H03L 7/16; H03L 7/18; H03L 7/197; H03L 7/1974
USPC .......... 327/147, 156; 331/10, 11, 16–18, 179; 375/373–376
See application file for complete search history.

(56) References Cited

U.S. PATENT DOCUMENTS

| | | | | |
|---|---|---|---|---|
| 5,382,922 | A * | 1/1995 | Gersbach et al. ............. | 331/1 A |
| 5,933,058 | A * | 8/1999 | Pinto et al. .................... | 331/17 |
| 5,949,281 | A * | 9/1999 | Sharpe ........................... | 329/325 |
| 6,078,633 | A * | 6/2000 | Shiotsu et al. ................ | 375/374 |
| 6,154,095 | A * | 11/2000 | Shigemori et al. ............. | 331/16 |
| 6,563,387 | B2 * | 5/2003 | Hirano et al. ................... | 331/11 |
| 6,657,917 | B2 * | 12/2003 | Lever ....................... | 365/189.07 |
| 7,015,763 | B1 * | 3/2006 | Hallivuori et al. .............. | 331/11 |
| 7,312,642 | B1 * | 12/2007 | Li et al. .......................... | 327/105 |
| 7,439,812 | B1 * | 10/2008 | Lombaard et al. ............ | 331/1 A |
| 7,486,147 | B2 * | 2/2009 | Khorram .......................... | 331/16 |
| 7,511,579 | B2 * | 3/2009 | Wang et al. .................... | 331/16 |
| 7,583,774 | B2 * | 9/2009 | Lesso ............................. | 375/377 |
| 7,940,129 | B1 * | 5/2011 | Tsang et al. .................... | 331/17 |
| 7,978,012 | B2 * | 7/2011 | Wood .............................. | 331/2 |
| 8,004,367 | B2 * | 8/2011 | Kythakyapuzha et al. ... | 331/179 |
| 8,008,979 | B2 * | 8/2011 | Hirano ............................ | 331/16 |
| 8,446,194 | B2 * | 5/2013 | Yun et al. ....................... | 327/156 |
| 2003/0222722 | A1 * | 12/2003 | Kwon .............................. | 331/17 |

OTHER PUBLICATIONS

Integrated Device Technology, Inc., FemtoClock® NG Universal Frequency Translator, IDT8T49N222I Date Sheet, Revision A, Sep. 27, 2012, 38 Pages.

* cited by examiner

*Primary Examiner* — Levi Gannon
(74) *Attorney, Agent, or Firm* — Myers, Bigel, et al.

(57) ABSTRACT

An apparatus includes a phase locked loop (PLL) circuit configured to generate a PLL output signal from an oscillator signal and a control circuit configured to generate a measure of a difference between the PLL output signal and an input clock signal at a control output thereof. The apparatus further includes a dynamic range shifter circuit coupling the control output of the control circuit to a control input (e.g., a feedback divider control input) of the PLL circuit and configured to shift a dynamic range of the control output of the control circuit with respect to a dynamic range of the control input of the PLL circuit. The apparatus may be implemented with an oscillator, such as a MEMs oscillator, in a single chip.

11 Claims, 6 Drawing Sheets

CLOCK GENERATION CIRCUITS USING JITTER ATTENUATION CONTROL CIRCUITS WITH DYNAMIC RANGE SHIFTING

FIELD

The inventive subject matter relates to clock generator circuits and, more particularly, to jitter-attenuating clock generator circuits.

BACKGROUND OF THE INVENTION

Frequency synthesizer circuits are commonly used in electronic devices. Frequency synthesizer integrated circuits (ICs) may be used, for example, to generate clock signals with user-selectable frequencies for computing, bus communications and other electronics applications.

Some frequency synthesizer ICs may provide jitter attenuation using a dual PLL loop structure. For example, some conventional ICs use dual PLL structure including a fractional-N phase locked loop (PLL) that receives a reference clock signal from a crystal oscillator and another PLL control circuit that receives an input clock signal and generates a control signal that controls a feedback divider of the crystal oscillator-based fractional-N PLL, which provides jitter attenuation. Such a device may also provide frequency translation with respect to the input clock signal. An example of such a device is the IDT8T49N222I FemtoClock® NG Frequency Translator/Synthesizer, described in a data sheet entitled "FemtoClock® NG Universal Frequency Translator" (2012).

SUMMARY

Some embodiments of the inventive subject matter provide an apparatus including a phase locked loop (PLL) circuit configured to generate a PLL output signal from an oscillator signal and a control circuit configured to generate a measure of a difference between the PLL output signal and an input clock signal at a control output thereof. The apparatus further includes a dynamic range shifter circuit coupling the control output of the control circuit to a control input (e.g., a feedback divider control input) of the PLL circuit and configured to shift a dynamic range of the control output of the control circuit with respect to a dynamic range of the control input of the PLL circuit.

The control circuit may be configured to generate a first control signal responsive to the PLL output signal and the input clock signal. The dynamic range shifter circuit may be configured to apply a second control signal to the control input of the PLL circuit responsive to the first control signal and to shift the dynamic range of the control output of the control circuit with respect to the dynamic range of the control input of the PLL circuit based on a relationship of the first control signal to a reference. In some embodiments, the control circuit may include an analog PLL control circuit configured to generate an analog control signal and an analog-to-digital converter (ADC) circuit configured to generate the first control signal from the analog control signal. In further embodiments, the control circuit may include a digital PLL circuit configured to generate the first control signal.

In some embodiments, the apparatus may further include an oscillator configured to generate the oscillator signal. At least the oscillator and the PLL circuit may be implemented in the same integrated circuit chip. The oscillator may include, for example, a microelectromechanical system (MEMS) oscillator.

Some embodiments of the inventive subject matter provide an apparatus including a phase locked loop (PLL) circuit configured to generate a PLL output signal from an oscillator signal and controlled by a control signal applied to a control input of the PLL circuit. The apparatus further includes an adaptive control circuit configured to generate a measure of a difference between an input clock signal and the PLL output signal and to generate the control signal from the generated measure with an offset that varies based on a relationship of the measure to a reference. The adaptive control circuit may be configured to generate the measure at a greater rate than the offset.

In some embodiments, the adaptive control circuit may include a control circuit configured to generate a first control signal responsive to the input clock signal and the PLL output signal. The adaptive control circuit may further include a dynamic range shifter circuit configured to determine a relationship of the first control signal to a reference, to generate a second control signal from the first control signal and the determined relationship, and to apply the second control signal to the control input of the PLL circuit. The dynamic range shifter circuit may be configured to shift a dynamic range of an output of the control circuit with respect to a dynamic range of the control input of the PLL circuit.

In some embodiments, the control circuit may include an ADC circuit configured to generate the first control signal. The dynamic range shifter circuit may be configured to increment and decrement an offset signal responsive to the first control signal and to combine the first control signal and the offset signal to generate the second control signal. The ADC circuit may be configured to update the first control signal at a first rate and the dynamic range shifter circuit may be configured to update the offset signal at a second rate less than the first rate. The control circuit may further include a phase detector and charge pump circuit, along with a loop filter circuit having an input coupled to an output of the phase detector and charge pump circuit and an output coupled to an input of the ADC circuit.

Still further embodiments of the inventive subject matter provide an integrated circuit chip including an oscillator configured to produce an oscillator signal and a fractional-N phase locked loop (PLL) configured to generate a PLL output signal from the oscillator signal and having a feedback divider that varies responsive to a control signal applied to a control input thereof. The chip also includes a control circuit configured to receive an input clock signal and the PLL output signal. The chip further includes a dynamic range shifter circuit coupling an output of the control circuit to the control input of the fractional-N PLL circuit and configured to shift a dynamic range of the output of the control circuit with respect to a dynamic range of the control input of the feedback divider.

The control circuit may be configured to generate a first control signal. The dynamic range shifter circuit may be configured to apply a second control signal to the control input of the feedback divider responsive to the first control signal and to shift a dynamic range of the output of the control circuit with respect to a dynamic range of the control input of the feedback divider based on a relationship of the first control signal to a reference. The oscillator may include a MEMS oscillator.

BRIEF DESCRIPTION OF THE DRAWINGS

The accompanying drawings, which are included to provide a further understanding of the inventive subject matter and are incorporated in and constitute a part of this application, illustrate certain embodiment(s) of the inventive subject matter. In the drawings.

DETAILED DESCRIPTION

Embodiments of the inventive subject matter now will be described more fully hereinafter with reference to the accompanying drawings, in which embodiments of the inventive subject matter are shown. This inventive subject matter may, however, be embodied in many different forms and should not be construed as limited to the embodiments set forth herein. Rather, these embodiments are provided so that this disclosure will be thorough and complete, and will fully convey the scope of the inventive subject matter to those skilled in the art. Like numbers refer to like items throughout.

It will be understood that, although the terms first, second, etc. may be used herein to describe various items, these items should not be limited by these terms. These terms are only used to distinguish one item from another. For example, a first item could be termed a second item, and, similarly, a second item could be termed a first item, without departing from the scope of the inventive subject matter. As used herein, the term "and/or" includes any and all combinations of one or more of the associated listed items.

It will be understood that when an item is referred to as being "connected" or "coupled" to another item, it can be directly connected or coupled to the other item or intervening items may be present. In contrast, when an item is referred to as being "directly connected" or "directly coupled" to another item, there are no intervening items present. Throughout the specification, like reference numerals in the drawings denote like items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms used herein should be interpreted as having a meaning that is consistent with their meaning in the context of this specification and the relevant art and will not be interpreted in an idealized or overly formal sense unless expressly so defined herein. The term "plurality" is used herein to refer to two or more of the referenced item.

Figure 1:
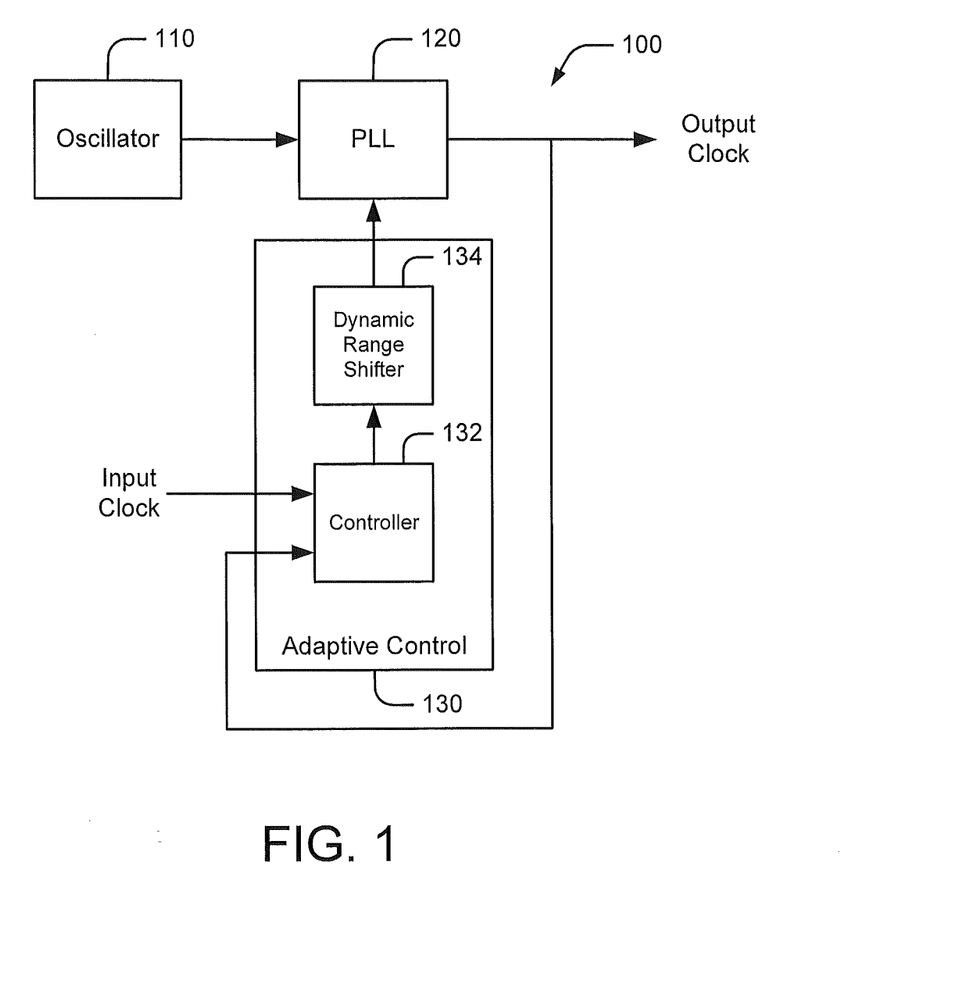
FIG. 1 illustrates a frequency synthesizer with adaptive control according to some embodiments.

FIG. 1 illustrates an apparatus 100 according to some embodiments of the inventive subject matter. The apparatus 100 includes an oscillator 110, which produces an oscillator signal that is applied to a phase locked loop (PLL) circuit 120 that responsively produces an output clock signal. The PLL circuit 120 includes a control input, which controls a relationship between the output clock signal and the input oscillator signal. For example, the PLL circuit 120 may be a fractional-N PLL and the control input may control a division provided by a feedback divider of the PLL circuit 120.

It will be understood that the oscillator 110 may include any of a number of different types of oscillators, including, but not limited to, microelectromechanical system (MEMS) resonators, piezoelectric resonators (e.g., quartz crystal resonators), LC resonators, etc. In addition to a resonant structure, the oscillator 110 may include additional circuitry, such as circuitry for excitation of the resonator and/or circuitry for sensing the resonator and processing signals generated by the resonator. It will be appreciated that the PLL circuit 120 may use analog compensation (e.g., a charge pump and analog loop filter) or a digital compensation (e.g., a digital loop filter).

An adaptive control circuit 130 applies a control signal to the control input of the PLL circuit 120 responsive to an input clock signal. The adaptive control circuit 130 includes a control circuit 132 that generates a measure of a timing difference between the output clock signal produced by the PLL circuit 120 and the input clock signal. The adaptive control circuit 130 further includes a dynamic range shifter circuit 134 that couples a control output of the control circuit 132 to the control input of the PLL circuit 120. The dynamic range shifter circuit 134 is configured to shift a dynamic range of the control output of the control circuit 132 with respect to a dynamic range of the control input of the PLL circuit 120. In some embodiments, this shifting may occur responsive to comparison of the output of the control circuit 132 to a reference, such that, as the frequency of the oscillating signal produced by the oscillator 110 drifts with temperature, the dynamic range of control circuit may be moved to maintain effective jitter attenuation of the output clock signal produced by the PLL circuit 120.

Figure 2:
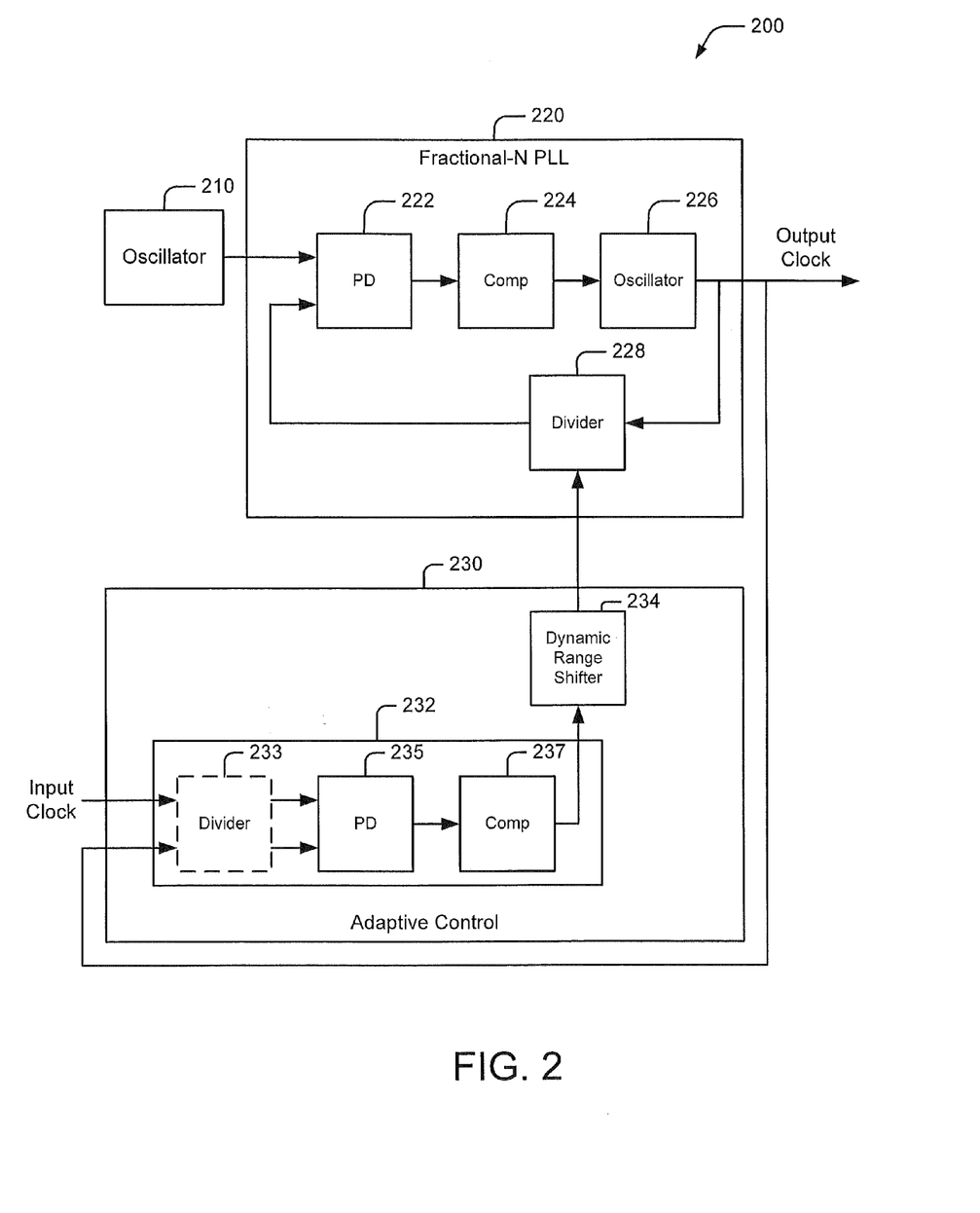
FIG. 2 illustrates a frequency synthesizer using a fractional-N PLL with feedback division control using a PLL controller with adaptive dynamic range shifting according to some embodiments.

FIG. 2 illustrates a system 200 according to further embodiments. A fractional-N PLL circuit 220 includes a phase detector (PD) 222, a compensator 224, a controlled oscillator 226 and a feedback divider 228. The phase detector 222 is configured to generate a measure of a difference between an oscillator signal generated by a source oscillator 210 and an output signal produced by the feedback divider 228, and generates a corresponding signal (e.g., an error signal) that is applied to the compensator 224. The compensator 224 responsively generates a control signal that controls the controlled oscillator 226. The output of the oscillator 226 is fed to the feedback divider 228, which translates the frequency of the output signal based on a signal applied to a control input thereof.

It will be appreciated that the fractional-N PLL circuit 220 may have an analog or digital forward path. The phase detector 222 may include, for example, a phase detector and charge pump that generates a current representative of the error, and the compensator 224 may include an analog loop filter. The controlled oscillator 226 may include a voltage controlled oscillator (VCO), and the loop filter may generate a voltage to control the VCO. Alternatively, the phase detector 222 may provide a digital output, the compensator 224 may include a digital loop filter, and the controlled oscillator 226 may include a digitally controlled oscillator (DCO).

As further shown in FIG. 2, the control signal for the feedback divider 228 may be provided by an adaptive control circuit 230. The adaptive control circuit 230 includes a second PLL control circuit 232 including a phase detector 235 and a compensator 237. The phase detector 235 is configured to generate a measure of a timing difference between the output clock signal and an input clock signal and to generate an error signal that is provided to the compensator 237. As also shown, the PLL control circuit 232 may further include a divider circuit 233, which may include respective dividers that divide down the input clock signal and the PLL output clock signal and which may be used if a translation from the frequency of the input clock signal to the output clock signal is desired. As with the PLL control circuitry in the fractional-N PLL circuit 220, the compensator 237 may be analog or digital. A control signal output by the PLL control circuit 232 is applied to a dynamic range shifter circuit 234, which is configured to shift a dynamic range of the output of the PLL control circuit 232 with respect to the control input of the feedback divider 228 of the fractional-N PLL circuit 220.

Figure 3:
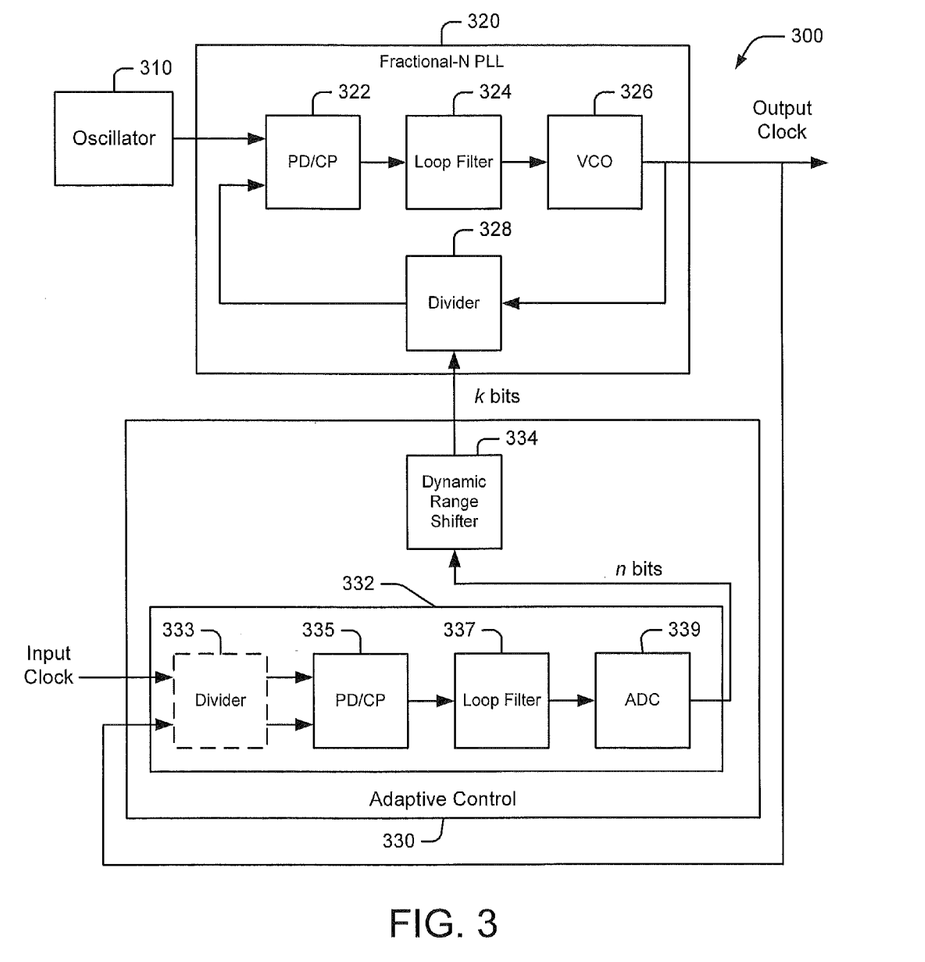
FIG. 3 illustrates a frequency synthesizer using an analog fractional-N PLL having feedback division controlled by an analog PLL controller with adaptive range shifting according to some embodiments.

FIG. 3 illustrates an apparatus 300 using analog PLL compensation according to some embodiments. A fractional-N PLL circuit 320 includes a phase detector/charge pump 322, an analog loop filter 324 and a voltage controlled oscillator (VCO) 326 and a feedback divider 328. The feedback divider 328 has a control input that is configured to receive a control signal, e.g., a sequence of k-bit digital values that controls a division factor applied by the feedback divider 328.

The control signal is generated by an adaptive control circuit 330, which includes a PLL control circuit 332 that provides analog loop compensation. The PLL control circuit 332 includes a phase detector/charge pump 335, an analog loop filter 337 and an analog-to-digital converter (ADC) 339. The phase detector/charge pump 335 generates a measure of a difference between an input clock signal and the output signal produced by the fractional-N PLL circuit 320 (e.g., an error signal), which is applied to the loop filter 337. The ADC 339 converts the analog output of the loop filter 337 to an n-bit digital signal. The ADC 339 may include, for example, a delta-sigma converter that produces a one-bit output stream and a converter that converts the one-bit output stream to n-bit values using, for example, a moving average filter.

The adaptive control circuit 330 further includes a dynamic range shifter circuit 334, which produces a k-bit output from the n-bit input and shifts a dynamic range of the output of the ADC 339 with respect to a dynamic range of the control input to the feedback divider 328 of the fractional-N PLL circuit 320. The dynamic range shift may be accomplished, for example, by introducing an offset that is based on a comparison of the output of the ADC 339 to a reference. For example, the offset introduced by the dynamic range shifter circuit 334 may be increased or decreased in response to the comparison indicating an impending saturation of the output of the ADC 339 due to a drift in the frequency of the oscillator 310.

Figure 4:
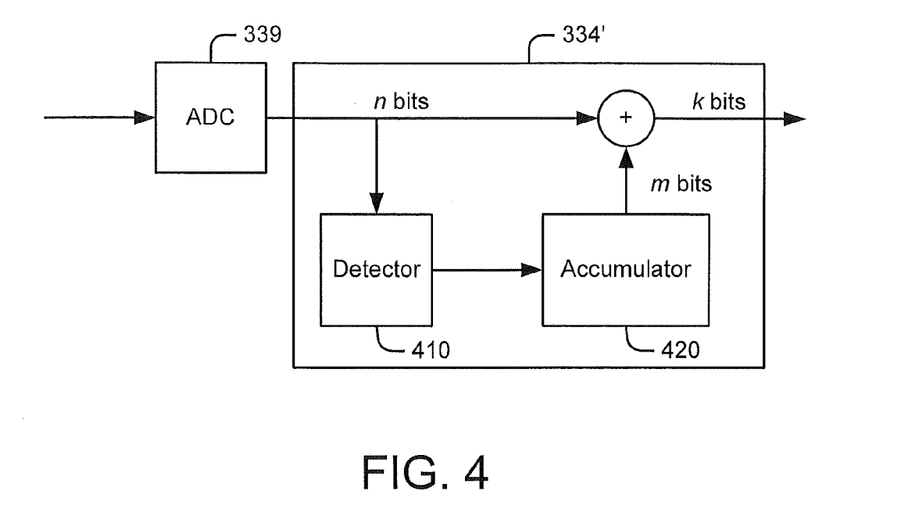
FIG. 4 illustrates a dynamic range shifter circuit for the frequency synthesizer of FIG. 3.

FIG. 4 illustrates an example of a dynamic range shifter circuit 334' that shifts a dynamic range of a control output coupled thereto based on comparison of the a control signal produced by the control output to a reference. The dynamic range shifter circuit 334' includes an accumulator circuit 420 which produces an m-bit output. The dynamic range shifter circuit 334' further includes a detector circuit 410, which is configured to compare the n-bit values received from the ADC 339 to a reference and to responsively increment and decrement the m-bit accumulator output. For example, the detector circuit 410 may compare the n-bit values produced by the ADC 339 to upper and lower thresholds. If an n-bit value exceeds the upper threshold, the detector circuit 410 may increment the m-bit output of the accumulator. If an n-bit value falls below the lower threshold, the detector circuit 410 may decrement the m-bit accumulator output. The n-bit values produced by the ADC 339 are combined with the m-bit output of the accumulator 420 to produce the k-bit value applied to the feedback divider 328 of the fractional-N PLL circuit 320. In particular, the m bits of the accumulator output may serve as the most significant bits of the k-bit output, such that changes in the accumulator output shift the effective dynamic range of the output of the ADC 339 with respect to the control input of the feedback divider 328 of the fractional-N PLL circuit 320.

Figure 5:
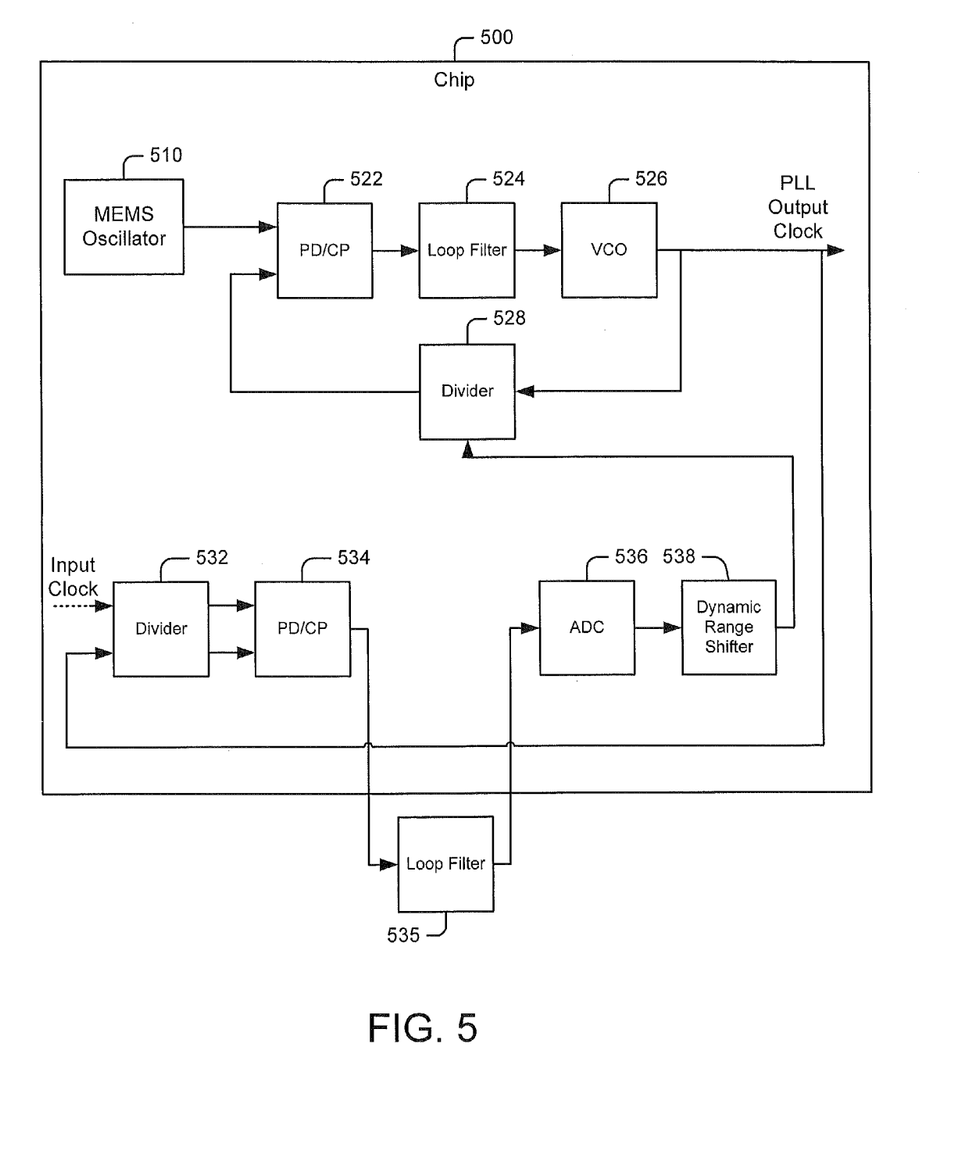
FIG. 5 illustrates an integrated circuit frequency synthesizer according to some embodiments.

Circuitry along the lines described above with reference to FIGS. 3 and 4 may be used to provide an integrated circuit clock translator/jitter attenuator chip that includes a microelectromechanical system (MEMS) oscillator integrated therein. FIG. 5 illustrates such a chip 500. The chip 500 includes a MEMS oscillator 510, which provides an oscillator signal to a fractional-N PLL circuit that is controlled by an adaptive control circuit. The fractional-N PLL circuit includes a phase detector/charge pump 522, an analog loop filter 524, a voltage controlled oscillator 526, and a feedback divider 528. The feedback divider 528 is configured to provide variable feedback frequency division responsive to a control signal provided by the adaptive control circuit.

The adaptive control circuit includes a clock divider circuit 532, a phase detector/charge pump 534, an ADC 536 and a dynamic range shifter circuit 538, which are included in the chip 500. A loop filter 535 is implemented using external components coupled to the chip 500, which allows for user selection of the loop filter performance characteristics. The clock divider circuit 532 receives an input clock signal and an output clock signal produced by the VCO of the fractional-N PLL circuit. The input clock signal may be an externally supplied clock signal or a clock signal derived therefrom. The clock divider circuit 532 may include respective dividers that divide the PLL output clock signal and the input clock signal to provide a desired frequency translation between the input clock signal frequency and the PLL output clock frequency. The phase detector/charge pump 534 receives the divided clock signal and responsively generates an error signal that is provided to the loop filter 535. The voltage output of the loop filter 535 is provided to the ADC 536, which produces a corresponding digital output. The dynamic range shifter circuit 538 receives the digital output of the ADC 536 and responsively provides the control signal to the control input of the feedback divider 528 of the fractional-N PLL circuit.

The chip 500 may include additional circuitry, such as additional dividers, level translators or other circuits through which the output clock signal produced by the fractional-N PLL circuit may be passed to generate clock signals having a desired frequency and/or format for provision to external recipient devices. The chip 500 may also include additional circuitry, such as control registers for configuration of the clock divider 532 and other components of the chip 500.

The adaptive control circuitry used in the chip 500 enables the use of a MEMS oscillator in place of a crystal oscillator, thus enabling a greater degree of circuit integration and reduced cost while still providing desirable jitter attenuation. One potential problem associated with using MEMS oscillators in jitter attenuation circuits is that MEMS oscillators generally exhibit greater output frequency drift with temperature in comparison to crystal oscillators. For example, the output of a crystal oscillator may vary less than one hundred ppm over a nominal temperature range, while the output frequency of a MEMS oscillator may vary on the order of several thousand ppm over the same temperature range. One potential approach for dealing with such wider frequency variation of a MEMS oscillator would be to use a dual PLL control architecture as used in conventional crystal oscillator based designs, but with an increased dynamic range of the outer PLL to attempt to compensate for the greater frequency variation. However, such an approach may introduce unacceptably high levels of noise into the output clock signal.

In contrast, the chip 500 may adapt the control of the fractional-N PLL as temperature of the MEMS oscillator 510 varies to allow for wide effective dynamic range control without introducing undue noise. As the MEMS oscillator 510 changes temperature, the output of the ADC 536 may drift towards saturation. When the dynamic range shifter circuit 538 determines that the output of the ADC 536 has crossed a pre-saturation threshold, it may responsively change an offset in the control signal provided to the feedback divider 528 to effectively shift the dynamic range of the output of the ADC 536 with respect to the dynamic range of the control input of the feedback divider 528, thus reducing the likelihood of saturation. The dynamic range shifter circuit 538 may use, for example, an arrangement such as that illustrated in FIG. 4 to provide such an offset. Because frequency variation arising from temperature changes may be relatively slow, the offset may be updated at a lower rate than the rate at which the control circuit including the ADC 536 generates output values, thus reducing the likelihood of introducing instability in the operation of the jitter control loop.

Figure 6:
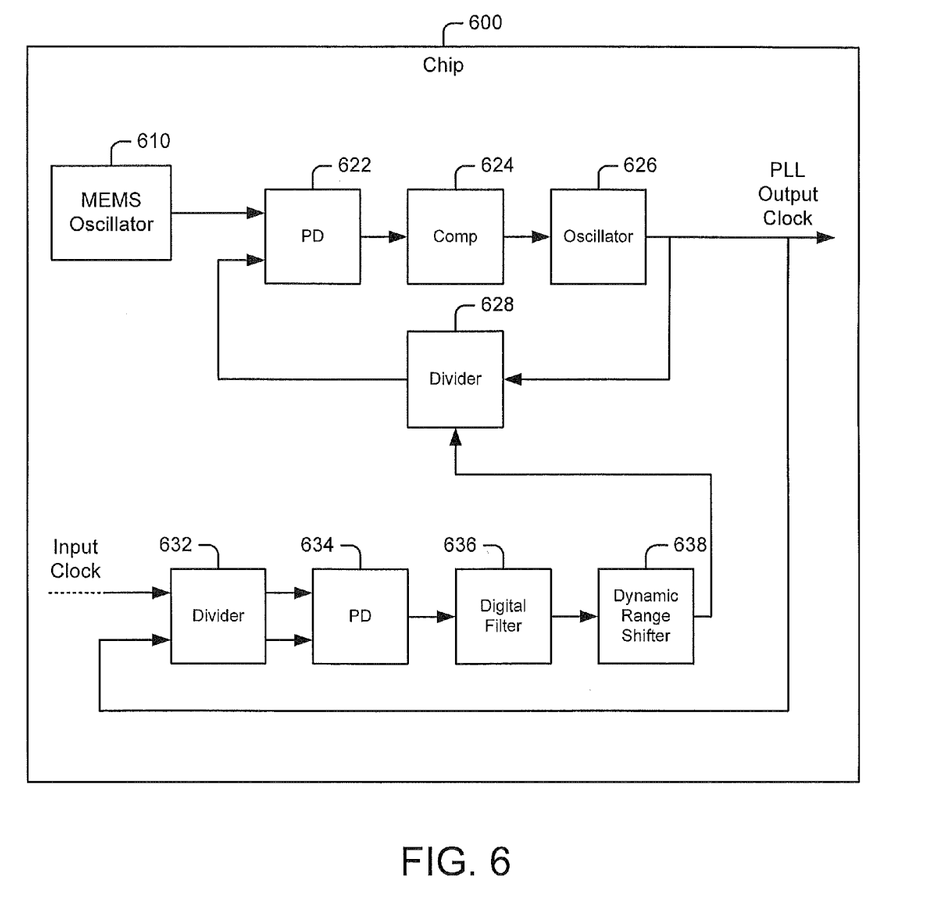
FIG. 6 illustrates an integrated circuit frequency synthesizer according to further embodiments.

The chip 500 shown in FIG. 5 uses analog PLL circuitry, but it will be appreciated that similar operations may be provided by digital PLL circuitry. FIG. 6 illustrates an integrated circuit chip 600 that includes a MEMS oscillator 610 coupled to a fractional-N PLL circuit that is controlled by an adaptive control circuit that uses a digital PLL control architecture. The fractional-N PLL circuit may be an analog or digital PLL, and includes a phase detector 622, a compensator 624, a controlled oscillator 626, and a feedback divider 628. The feedback divider 628 is configured to provide variable feedback frequency division responsive to a control signal provided by the adaptive control circuit.

The adaptive control circuit includes a clock divider 632, a phase detector 634, an on-board digital loop filter 636 and a dynamic range shifter circuit 638. The clock divider 632 receives an input clock signal, which may be an external clock signal or a clock signal derived therefrom, and a PLL output clock signal produced by the fractional-N PLL circuit. The clock divider 632 provides a frequency division of these clock signals to provide a desired frequency translation between the input clock signal and the PLL output clock signal. The phase detector 634 generates a measure of a timing difference between the clock signals, generating an error signal that is filtered by the loop filter 636. The dynamic range shifter circuit 638 receives the output of the loop filter 636 and responsively generates the control signal applied to the control input of the feedback divider 628 of the fractional-N PLL circuit. The dynamic range shifter circuit 638 is configured to provide dynamic range shifting as described above. Because of the digital nature of the PLL control circuitry in the adaptive control circuit, the ADC 536 included in the chip 500 may be eliminated and the loop filter may be incorporated in the chip 600. Operating parameters of the adaptive control circuit and other components of the chip 600 may be user-programmable using registers or other control circuitry. Similar to the chip 500 of FIG. 6, the chip 600 may include additional circuitry, such as additional dividers, level translators or other circuits through which the output clock signal produced by the fractional-N PLL circuit may be passed to generate clock signals having a desired frequency and/or format for provision to external recipient devices.

It will be understood that the chips 500, 600 illustrated in FIGS. 5 and 6 may be clock generator/frequency translator ICs. Such ICs may be multifunctional, e.g., they may perform frequency synthesis, frequency translation and jitter attenuation. Such functions may be user-selectable and/or programmable. The chips 500, 600 may also be more highly integrated devices, such as application-specific ICs used for control or communications functions, and may include circuitry in addition to the clock translation and jitter attenuation circuitry shown in FIGS. 5 and 6.

In the drawings and specification, there have been disclosed typical embodiments of the inventive subject matter and, although specific terms are employed, they are used in a generic and descriptive sense only and not for purposes of limitation, the scope of the inventive subject matter being set forth in the following claims.

What is claimed is:

1. An apparatus comprising:
 a phase locked loop (PLL) circuit configured to generate a PLL output signal from an oscillator signal and controlled based on a control signal applied to a control input of the PLL circuit; and
 an adaptive control circuit configured to generate a measure of a difference between an input clock signal and the PLL output signal and to apply an offset to the measure to generate the control signal, wherein the offset varies based on a relationship of the measure to a reference, wherein the adaptive control circuit is configured to generate the measure at a greater rate than an update rate of the offset.

2. The apparatus of claim 1, wherein the PLL circuit comprises a fractional-N PLL circuit comprising a feedback divider that varies responsive to the control signal.

3. The apparatus of claim 2, wherein the adaptive control circuit comprises:
 a control circuit configured to generate a first control signal responsive to the input clock signal and the PLL output signal; and
 a dynamic range shifter circuit configured to determine a relationship of the first control signal to a reference, to generate a second control signal from the first control signal and the determined relationship and to apply the second control signal to the control input of the PLL circuit.

4. The apparatus of claim 3, wherein the dynamic range shifter circuit is configured to shift a dynamic range of an output of the control circuit with respect to the control input of the PLL circuit.

5. The apparatus of claim 3:
 wherein the control circuit comprises an analog-to-digital (ADC) circuit configured to generate the first control signal; and
 wherein the dynamic range shifter circuit is configured to increment and decrement an offset signal responsive to the first control signal and to combine the first control signal and the offset signal to generate the second control signal.

6. The apparatus of claim 5, wherein the ADC circuit is configured to update the first control signal at a first rate and wherein the dynamic range shifter circuit is configured to update the offset signal at a second rate less than the first rate.

7. The apparatus of claim 5, wherein the control circuit further comprises:

a phase detector and charge pump circuit; and
a loop filter circuit having an input coupled to an output of the phase detector and charge pump circuit and an output coupled to an input of the ADC circuit.

8. The apparatus of claim 1, further comprising an oscillator configured to generate the oscillator signal, and wherein at least the oscillator and the PLL circuit are implemented in the same single integrated circuit chip.

9. The apparatus of claim 8, wherein the oscillator comprises a MEMS oscillator.

10. An integrated circuit chip comprising:
an oscillator configured to produce an oscillator signal;
a fractional-N phase locked loop (PLL) configured to generate a PLL output signal from the oscillator signal;
a control circuit configured to receive an input clock signal and the PLL output signal and comprising an analog-to-digital converter (ADC) circuit configured to generate a first control signal responsive to a difference between the input clock signal and the PLL output signal; and
a dynamic range shifter circuit coupling an output of the ADC circuit to a feedback divider control input of the fractional-N PLL circuit and configured to generate a second control signal from the first control signal, wherein the dynamic range shifter circuit is configured shift a dynamic range of the first control signal with respect to the feedback divider control input responsive to a comparison of the first control signal to a reference.

11. The integrated circuit chip of claim 10, wherein the oscillator comprises a MEMS oscillator.

\* \* \* \* \*